United States Patent
Hunziker

(10) Patent No.: US 9,437,514 B2
(45) Date of Patent: Sep. 6, 2016

(54) SEMICONDUCTOR PACKAGE WITH COATED SIDE WALLS AND METHOD OF MANUFACTURE

(71) Applicant: Sensirion AG, Stafa (CH)

(72) Inventor: Werner Hunziker, Stafa (CH)

(73) Assignee: Sensirion AG, Stafa (CH)

( * ) Notice: Subject to any disclaimer, the term of this patent is extended or adjusted under 35 U.S.C. 154(b) by 0 days.

(21) Appl. No.: 14/698,436

(22) Filed: Apr. 28, 2015

(65) Prior Publication Data

US 2015/0325492 A1 Nov. 12, 2015

(30) Foreign Application Priority Data

May 7, 2014 (EP) .................................. 14167397

(51) Int. Cl.

| | | |
|---|---|---|
| *H01L 23/31* | (2006.01) | |
| *H01L 23/29* | (2006.01) | |
| *H01L 21/302* | (2006.01) | |
| *H01L 21/56* | (2006.01) | |
| *B81C 1/00* | (2006.01) | |

(52) U.S. Cl.
CPC ....... *H01L 23/3185* (2013.01); *B81C 1/00261* (2013.01); *B81C 1/00777* (2013.01); *H01L 21/302* (2013.01); *H01L 21/561* (2013.01); *H01L 23/293* (2013.01); *H01L 2924/0002* (2013.01)

(58) Field of Classification Search
CPC ............. H01L 23/3185; H01L 21/561; H01L 23/293; H01L 21/302; H01L 23/31; H01L 21/56; H01L 23/29

USPC ................................. 257/788, 787; 438/110
See application file for complete search history.

(56) References Cited

U.S. PATENT DOCUMENTS

| | | | |
|---|---|---|---|
| 2007/0190688 A1 | 8/2007 | Youn et al. | |
| 2010/0035373 A1* | 2/2010 | Hunziker | G01D 3/028 |
| | | | 438/48 |
| 2012/0088332 A1 | 4/2012 | Lee et al. | |
| 2013/0294034 A1 | 11/2013 | Kanryo et al. | |

FOREIGN PATENT DOCUMENTS

| | | |
|---|---|---|
| EP | 2684837 | 1/2014 |
| EP | 2942807 A1 * | 11/2015 |
| TW | 5544335 | 9/2003 |

OTHER PUBLICATIONS

European Search Report No. 14167397.0 dated Oct. 21, 2014.

* cited by examiner

*Primary Examiner* — Alexander Oscar Williams
(74) *Attorney, Agent, or Firm* — Cooper & Dunham LLP

(57) ABSTRACT

A semiconductor package including an integrated device, the package having a front side, a back side and side walls linking the front and back sides, wherein each side wall is coated, to at least 80% of its area, with a coating material different from the material(s) of the back and front sides. A method of manufacturing a semiconductor package by providing an assembly containing an array of the packages, the assembly having thickness d0 and being attached to a dicing tape of thickness dd, fabricating a set of first dicing streets with width w1 and depth d1<(d0+dd), filling the first dicing streets at least partially with a coating material, and fabricating, in the coating material in each first dicing street, a second dicing street with width w2≤w1 and depth d2≥d0 but <(d0+dd).

19 Claims, 5 Drawing Sheets d)

e)

a)

b)

c)

d)

SEMICONDUCTOR PACKAGE WITH COATED SIDE WALLS AND METHOD OF MANUFACTURE

CROSS REFERENCE TO RELATED APPLICATIONS

This application claims priority of European Patent Application 14167397.0, filed May 7, 2014, the contents of which is incorporated herein by reference in its entirety.

FIELD OF THE INVENTION

The present invention relates to a semiconductor package and a method for manufacturing a semiconductor package.

BACKGROUND OF THE INVENTION

When a semiconductor device is packaged, especially in a batch process, undesired particles may arise during device dicing, e.g. by sawing or laser cutting.

In KR100395754 B1 for example, a pre-cutting process is performed by cutting particular units of a semiconductor package. The particular units of the semiconductor package are cut by using a dicing wheel. A cleaning and a drying process is performed to clean cut sludge caused by the pre-cutting process. A laser beam cutting process is performed by cutting the remaining thickness of the semiconductor package.

In such a process, contamination may arise in form of particles released from the cut surfaces or there may be thermal impact arising from the laser cutting step.

SUMMARY OF THE INVENTION

Hence, according to a first aspect of the invention, there is provided a semiconductor package, comprising an integrated device, a front side of a material A and a back side of a material B opposite to the front side. Side walls link the front side and the back side. Each side wall is coated with a coating material to at least 80% of its area, wherein the coating material is different from the material A and different from the material B.

The term "semiconductor package" as used herein comprises an integrated device which may comprise one or more of a die, a chip, a substrate, e.g. a glass substrate or a ceramic substrate or a semiconductor substrate, and in particular a silicon substrate. The semiconductor package may further comprise means of electrical contacting, e.g. one or more of wire bonds, through-silicon-vias, a ball grid array, a land grid array, T-contacts, a lead frame or a printed circuit board, and/or packaging, e.g. a mold or a silicon cap or a silicon interposer. The semiconductor package, and in particular its integrated device may include features such as an integrated processing circuit and/or a suspended membrane and/or a heater structure.

In a preferred embodiment, the semiconductor package, and in particular its integrated device comprises a sensitive element which is sensitive to one or more of humidity, temperature, gas, pressure, gas flow or differential pressure. Hence, the semiconductor package may represent one or more of a humidity sensor, a temperature sensor, a gas sensor, a pressure sensor, a microphone, or a gas flow sensor.

Furthermore, the semiconductor package may contain additional features to support the operation of the sensitive element, e.g. a heater structure to heat the sensitive element and/or a suspended membrane to achieve thermal insulation and/or features to process the measurement signal of the sensitive element, e.g. an integrated processing circuit.

Material A and material B may be the same or different. They may each be combinations of materials. In one example, material A comprises mold compound and material B comprises mold compound and metal of a lead frame. In another example, material A and material B comprise silicon.

In a preferred embodiment, each side wall essentially is a cut surface. The term "cut surface" as used herein refers to a surface originating from a dicing process. Minor parts of the surface may still originate from a different process, e.g. etching.

In a preferred embodiment, the coating material seals the cut surface to reduce emission of particles related to a dicing process used to manufacture the cut surface and/or seals the cut surface to protect it.

Preferably, the coating material at each side wall comprises two front ends and a side face linking the front ends, wherein each side face is a cut surface.

In a preferred embodiment, the coating material comprises at least one of glue, encapsulant, acryl, silicone, epoxy, polyurethane or a material with less than 10% filler particles. These materials are chosen because they exhibit a low release of particles during dicing and because of their adhesive and sealing behavior.

In a preferred embodiment, the coating material has a width $w0$ of less than 100 micrometers. The thickness has an upper limit given by miniaturization of the semiconductor package.

Preferably, the coating material has a width $w0$ which is essential equal on all sidewalls of the diced semiconductor package.

In one embodiment, the coating material coated on at least one of the side walls has on a front end a positive or negative offset from the plain of the front side and/or back side of the diced semiconductor package.

In a preferred embodiment, the coating material coated on at least one of the side walls has at least one front end that has meniscus-like shape.

In one embodiment, at least one gap extends in a direction perpendicular to the side wall and is filled by a portion of the coating material. A gap in a side wall may for example arise in adhesive bonding of a silicon chip and a silicon cap. Filling the gap may serve to confine remains of dicing slurry and/or to protect the edges of a gap and/or the adhesive material which might be more sensitive to mechanical and chemical impact.

In one embodiment, the coating material coated on at least one of the side walls wraps around a lateral end of the front side and/or back side covering less than 20% of the area of the front side and/or back side. This may serve to protect the corresponding edges of the package and to increase adhesion of the coating material on the semiconductor package. The front or backside is not covered completely to allow access to cavities and/or openings to the inside of the package. This is especially relevant if the semiconductor package comprises a sensitive element that is sensitive to outside parameters, e.g. humidity, gas or pressure.

In another embodiment, the front end of the coating material coated on at least one of the side walls is covered by a lateral extension of the front side material A or by a lateral extension of the back side material B. This may serve to increase adhesion of the coating material and/or to hide it from view and/or to protect it from wear.

According to another aspect of the present invention, a method is provided for manufacturing a semiconductor package. A semiconductor package assembly containing an array of semiconductor packages for manufacturing a plurality of semiconductor packages is provided. Preferably, each semiconductor package comprises an integrated device. The semiconductor package assembly has a thickness d0 and is attached to a dicing tape of thickness dd.

In the following, a set of first dicing streets with a width w1 and a depth $d1<(d0+dd)$ is fabricated.

In the following, the set of first dicing streets is at least partially filled with a coating material.

In the following, in the coating material in each first dicing street of the set, a second dicing street with a width $w2<=w1$ and a depth $d2>=d0$ and $d2<(d0+dd)$ is fabricated.

The advantage of this method is that it allows the coating of side walls in a batch process.

In a preferred embodiment, the semiconductor package assembly has a front side of material A and back side of material B and the coating material is different from material A and from material B.

Material A and material B may be the same or different. They may each be combinations of materials. In one example, material A comprises mold compound and material B comprises mold compound and metal of a lead frame. In another example, material A and material B comprise silicon.

In one embodiment, the set of first dicing streets is filled with the coating material by applying the coating material in the set of first dicing streets.

In another embodiment, the set of first dicing streets is filled with the coating material by depositing the coating material in areas outside of but in contact with the set of first dicing streets and filling the set of first dicing streets by means of capillary force.

Preferably, the second dicing street in the coating material in each first dicing street of the set is fabricated in the center of each first dicing street of the set in such a way that a plurality of individual semiconductor packages having side walls that are coated by coating material of essentially equal width are formed.

In one embodiment, the depth of the set of first dicing streets is equal to the thickness of the semiconductor package assembly.

In another embodiment, the depth of the first dicing streets is smaller than the thickness of the semiconductor package assembly.

In one embodiment, the method for manufacturing a semiconductor package comprises a cleaning step after fabricating the first dicing streets.

In preferred embodiment, a curing step is performed after the application of the coating material.

According to another aspect of the present invention, a semiconductor package is manufactured according to above described method.

The described embodiments similarly pertain to the semiconductor package and the method. Synergetic effects may arise from different combinations of the embodiments although they might not be described in detail.

Other advantageous embodiments are listed in the dependent claims as well as in the description below.

BRIEF DESCRIPTION OF THE DRAWINGS

Embodiments of the present invention, aspects and advantages will become apparent from the following detailed description thereof. Such description makes reference to the annexed drawings, wherein the figures show.

DETAILED DESCRIPTION

Figure 1:
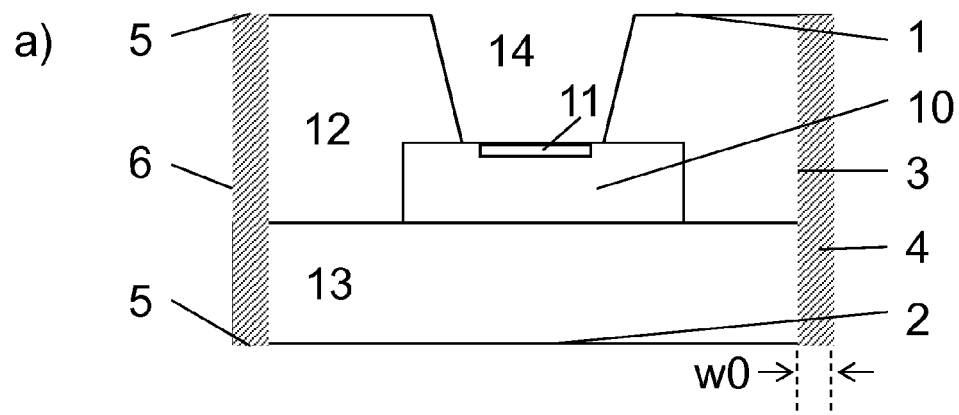
FIG. 1 a) to c) schematic sectional views of semiconductor packages in accordance with examples of the invention.
Figure 1:
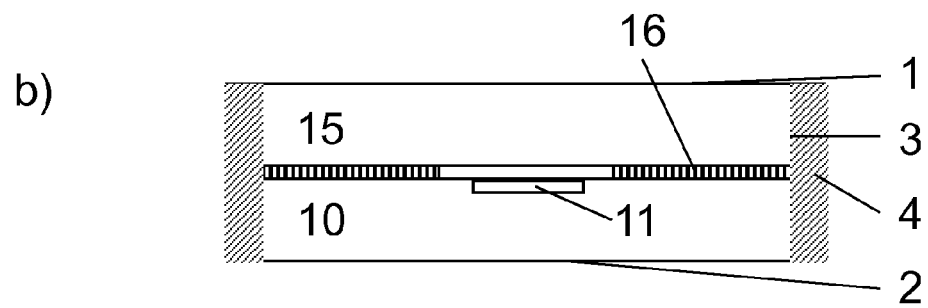
Figure 1:
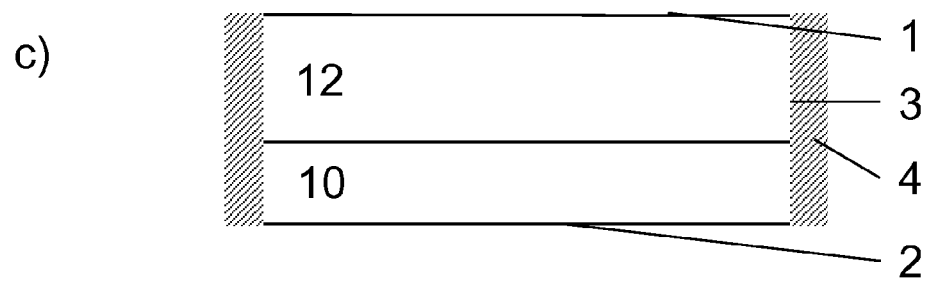

FIG. 1 a) shows a schematic sectional view of a semiconductor package in accordance with an embodiment of the present invention. The semiconductor package has a front side 1 and back side 2.

In this embodiment, a silicon die 10 which includes a sensitive element 11 is attached to a support 13. The silicon die 10 may include features such as an integrated processing circuit and/or a suspended membrane and/or a heater structure. The support 13 may comprise means for external electrical contacting, e.g. one of a printed circuit board, a ceramic support or a lead frame. In this embodiment, the semiconductor package comprises a mold 12 which has an access opening 14 from the front side 1 to the sensitive element 11. If the means for external electrical contacting is a lead frame, the lead frame may also be partially packaged in the mold.

In this embodiment, the semiconductor package has side walls 3 which are coated completely between front side 1 and back side 2 with a coating material 4 of width w0. The side walls 3 may be cut surfaces. Herein, cut surfaces refer to the side walls of a semiconductor package generated by dicing. The coating material 4 has two front ends 5 which are each in the plain of the front side 1 and back side 2 of the semiconductor package.

The coating material 4 seals the side walls 3 and may be a glue or encapsulant, e.g. comprising acryl, silicone, epoxy, polyurethane and preferentially with less than 10% filler particles. The coating material may be chosen to exhibit low particle emission if it is diced and/or to be suited as sealing material. The coating material 4 may reduce emission of particles related to a dicing process used to manufacture the cut surfaces. Such particles may arise due to the release of filling particles of mold compound which are commonly used to achieve thermal expansion matching between the mold material and silicon.

FIG. 1 b) shows another embodiment of a semiconductor package in accordance with an embodiment of the present invention. In this embodiment, a silicon die 10 with an integrated sensitive element 11 is capped with a silicon cap 15 by means of an adhesive material 16. The silicon die 10 may include features such as an integrated processing circuit and/or a suspended membrane and/or a heater structure as well as means for external contacting e.g. through silicon vias and/or metal balls. In this embodiment, the semiconductor package has side walls 3 which are coated completely between front side 1 and back side 2 with a coating material 4 of width w0. In this embodiment, the coating material 4 may serve to reduce environment impact on cut surfaces which may potentially be more sensitive than other surfaces.

FIG. 1 c) illustrates another embodiment of a semiconductor package in accordance with an embodiment of the present invention. In this embodiment, a silicon die 10 is capped with a mold compound 11. The silicon die 10 includes an integrated circuit and means for external contacting, e.g. through silicon vias and/or metal balls. In this embodiment, the coating material 4 may serve to reduce environment impact on cut surfaces which may potentially be more sensitive than other surfaces and it may reduce emission of particles related to a dicing process used to manufacture the cut surface.

Figure 2:
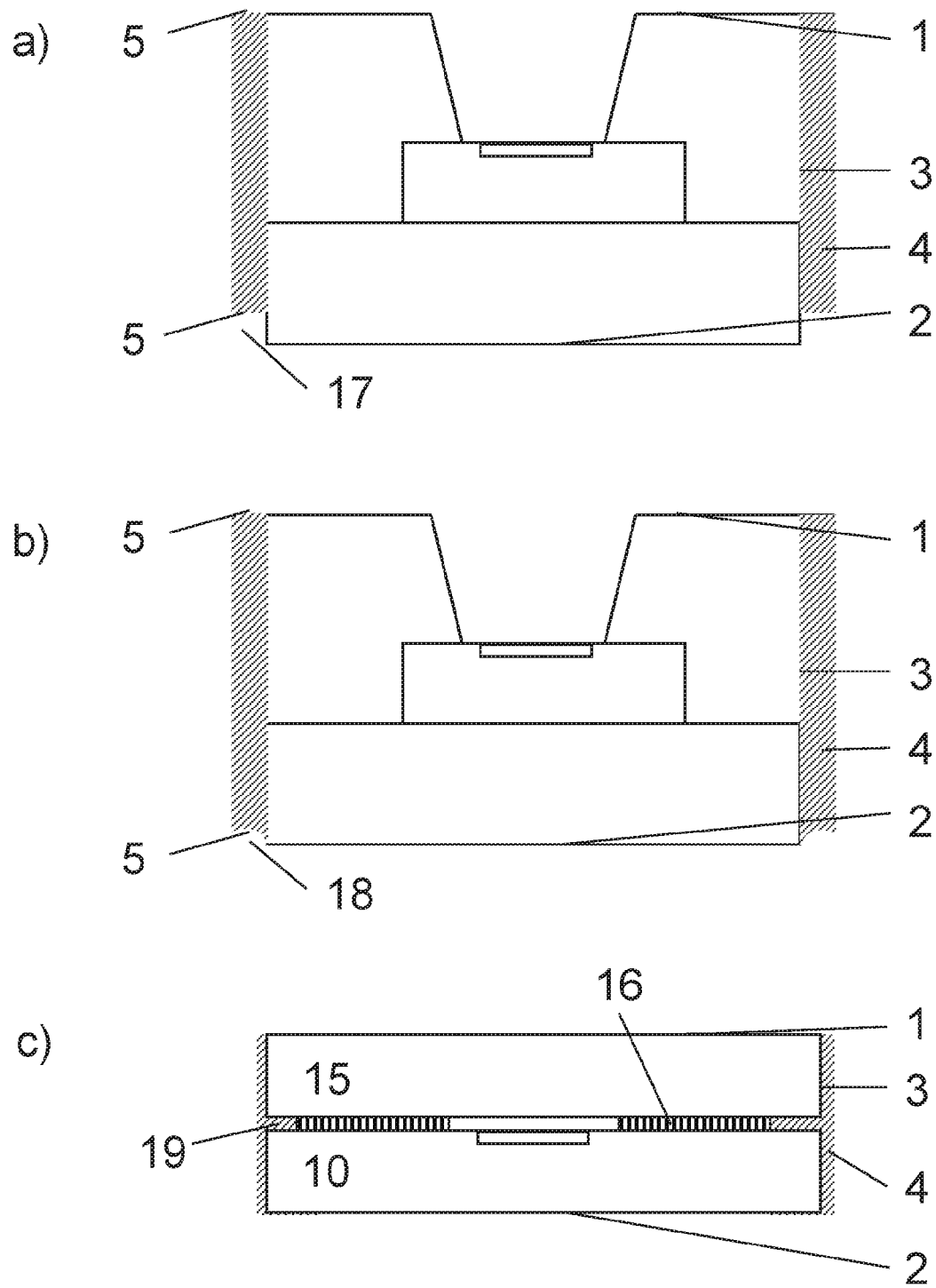
FIG. 2 a) to e) schematic sectional views of diced semiconductor packages in accordance with examples of the invention.
Figure 2:
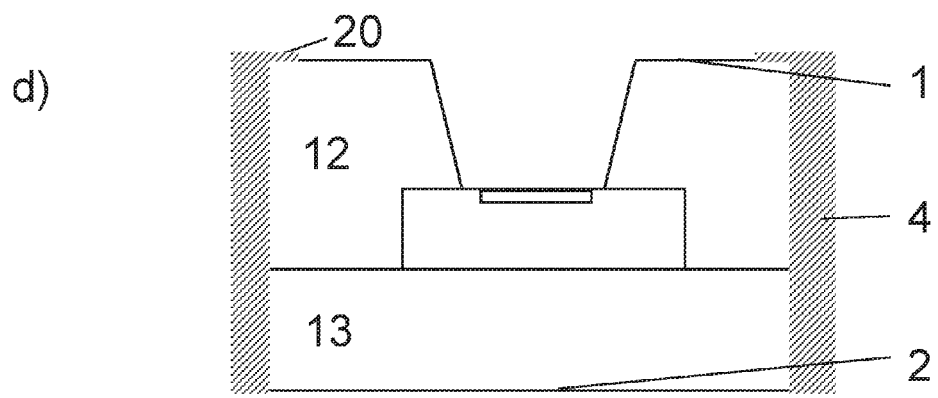
Figure 2:
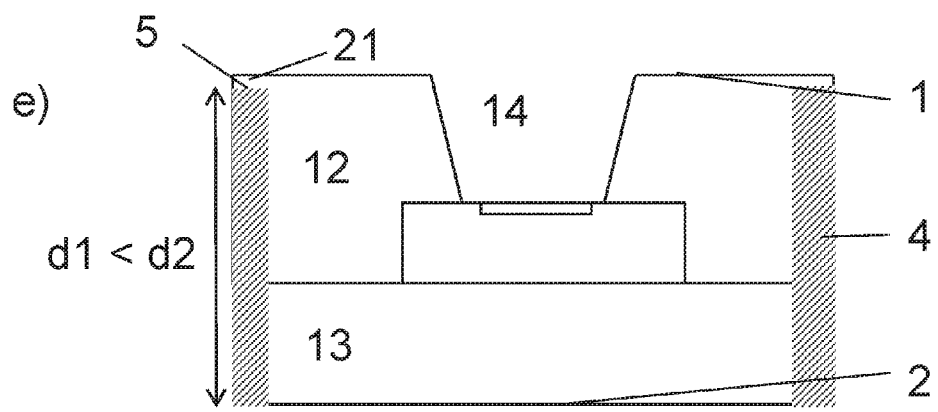

FIG. 2 *a*) shows another embodiment of a semiconductor package in accordance with an embodiment of the present invention. In this embodiment, the coating material 4 has a front end 5 which is to a limited extend negatively offset 17 from the plain of the back side 2 of the diced semiconductor package.

FIG. 2 *b*) illustrates another embodiment of a semiconductor package in accordance with an embodiment of the present invention. In this embodiment, the coating material 4 has a front end 5 that has meniscus-like shape 18.

FIG. 2 *c*) shows another embodiment of a semiconductor package in accordance with an embodiment of the present invention. In this embodiment, a gap 19 extends in a direction perpendicular to the side wall 3 and is filled by a portion of the coating material 4. In this embodiment, the gap 19 in the side wall 3 arises due to reduced lateral extension of the glue 16.

FIG. 2 *d*) illustrates another embodiment of a semiconductor package in accordance with an embodiment of the present invention. In this embodiment, the coating material 4 wraps around a lateral end 20 of the front side 1 and/or back side 2 covering less than 20% of the area of the front side 1 and/or back side 2. The coating of the edges may serve for their protection against mechanical impact and/or wear.

FIG. 2 *e*) shows another embodiment of a semiconductor package in accordance with an embodiment of the present invention. In this embodiment, a front end 5 of the coating material 4 is covered by a lateral extension 21 of the front side 1 material A.

Alternatively, a front end 5 of the coating material 4 may be covered by a lateral extension 21 of the back side 2 material B.

Figure 3:
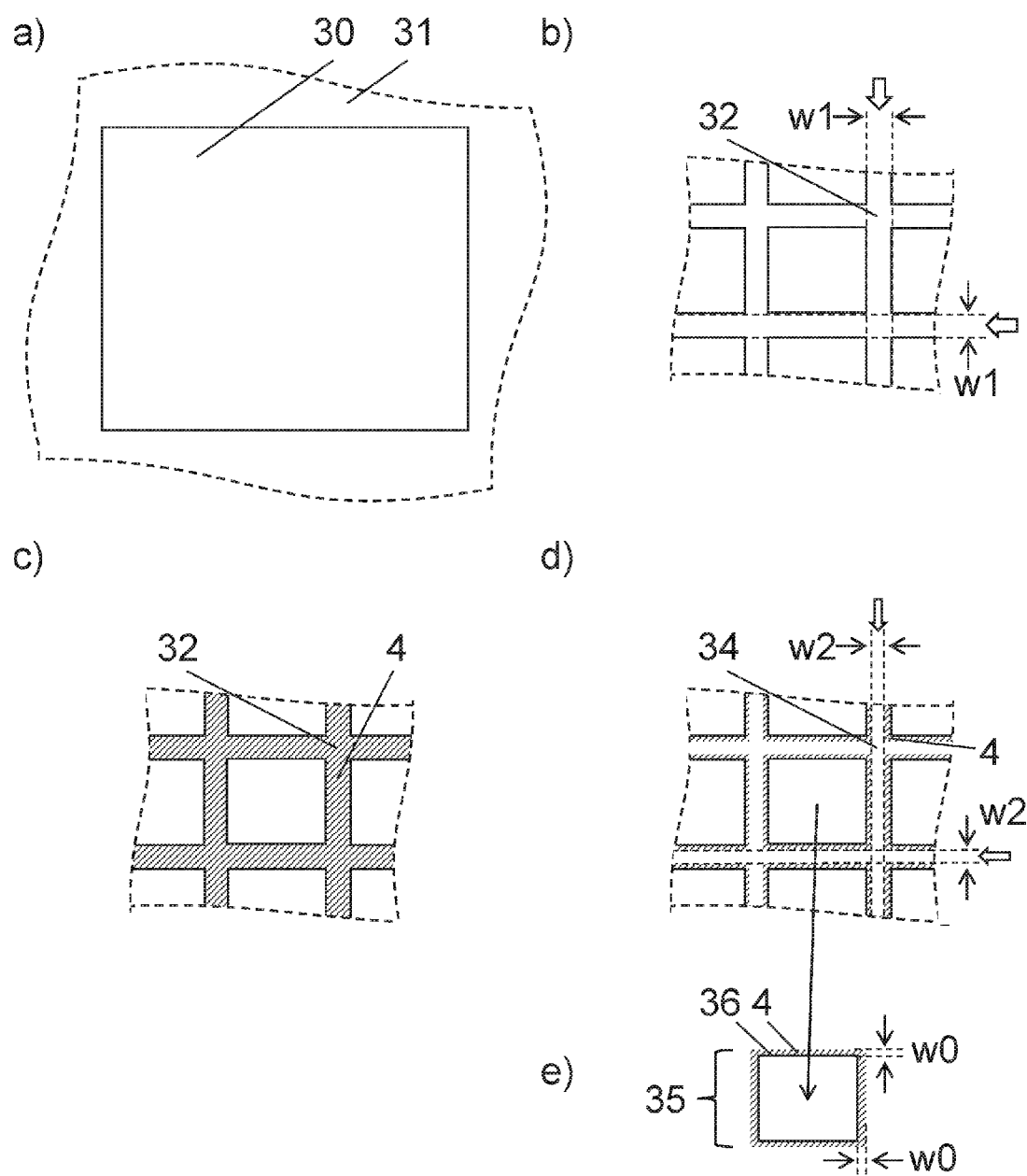
FIG. 3 in its diagrams a) to e) schematic top views of steps of manufacturing a semiconductor package in accordance with an example of the invention.
Figure 4:
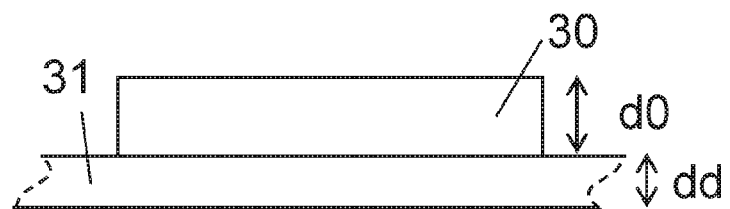
FIG. 4 in its diagrams a) to d) schematic sectional views of steps of manufacturing a semiconductor package in accordance with an example of the invention.
Figure 4:
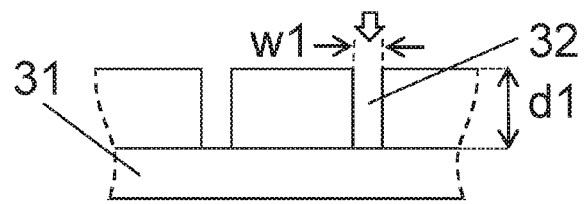
Figure 4:
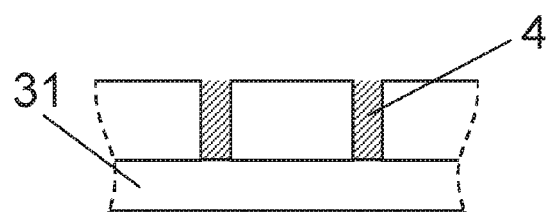
Figure 4:
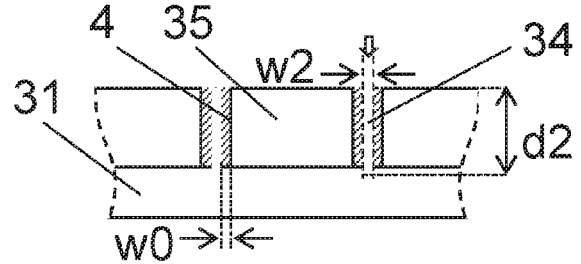

FIG. 3 illustrates in its diagrams a) to e) schematic top views of steps of manufacturing a semiconductor package in accordance with an example of the invention and FIG. 4 in its diagrams a) to d) schematic sectional views of the respective steps.

In FIGS. 3 *a*) and 4 *a*) a semiconductor package assembly 30 is provided. It contains an array of semiconductor packages for manufacturing a plurality of semiconductor packages. The semiconductor package assembly 30 has a thickness d0 and is attached to a dicing tape 31 of thickness dd.

If one of the two sides of the semiconductor package assembly 30 is more sensitive to contaminations than the other, this side may be chosen to be attached to the dicing tape 31. For example, if one side comprises access openings to sensitive elements, this side may be attached to the dicing tape 31. By this means, the more sensitive side may be protected by the dicing tape 31 from particles and slurry during the following dicing steps.

In FIGS. 3 *b*) and 4 *b*) a set of first dicing streets 32 with a width w1 and a depth d1<(d0+dd) is fabricated. The set of first dicing streets 32 is fabricated around individual semiconductor devices or groups of semiconductor devices. Dicing may be realized by sawing or laser cutting. The upper limit of the width w1 is given by the loss of material due to the dicing process and the lower limit by a stable and reproducible process, therefore w1 may be in a range of 30 to 500 micrometer.

In this embodiment, the depth d1 of the set of first dicing streets 32 is essentially equal to the thickness d0 of the semiconductor package assembly 30. Herein, essentially equal means within the accuracy limits of the corresponding manufacturing process.

In another embodiment, the depth d1 of set of first dicing streets 32 is smaller than the thickness d0 of the semiconductor package assembly 30.

In one embodiment, a cleaning step may be applied after fabricating the set of first dicing streets 32.

In FIGS. 3 *c*) and 4 *c*) the set of first dicing streets 32 are filled with a coating material 4. The semiconductor package assembly 30 has a front side of material A and back side of material B. Material A and material B may be the same or different. They may each be combinations of materials. In one example, material A comprises mold compound and material B comprises mold compound and metal of a lead frame. In another example, material A and material B comprise silicon.

Preferentially, the coating material 4 is different from material A and from material B.

In one embodiment, the set of first dicing streets 32 is filled with the coating material 4 by applying the coating material 4 in the set of first dicing streets 32. This may have the advantage of accurate control of the amount of coating material 4. This process may be limited by the small width w1 of each first dicing street of the set 32 which may lead to undesired deposition of the coating material in the vicinity of each first dicing street of the set 32 and/or by the effort and time to fill each first dicing street of the set 32.

Therefore, in another embodiment, the set of first dicing streets 32 is filled with the coating material 4 by depositing the coating material 4 in areas outside of but in contact with the set of first dicing streets 32 and filling the set of first dicing streets 32 by means of capillary force.

In one embodiment, a curing step is performed after the application of the coating material 4.

In FIGS. 3 *d*) and 4 *d*) in the coating material 4 in each first dicing street of the set 32, a second dicing street (34) with a width w2<=w1 and a depth d2>=d0 and d2<(d0+dd) is fabricated.

In this embodiment, the second dicing street 34 in the coating material 4 in each first dicing street of the set 32 is fabricated in the center of each first dicing street of the set 32 in such a way that a plurality of individual semiconductor packages 35 having side walls 36 that are coated by coating material 4 of essentially equal width w0 are formed.

FIG. 3 *e*) shows in top view an example of a semiconductor package manufactured according to one embodiment of the method.

The semiconductor package may e.g. be released from the dicing tape by UV radiation (UV release tape).

It should further be noted that in any removal of material during manufacturing, the corresponding structures may be created using a chemical (wet) etching process, plasma etching process, laser cutting, mechanical milling or a combination of any of these processes, where suitable.

While above there are shown and described embodiments of the invention, it is to be understood that the invention is not limited thereto but may be otherwise variously embodied and practiced within the scope of the following claims.

The invention claimed is:

1. A semiconductor package, comprising
   an integrated device comprising a sensitive element,
   a front side of a material A wherein material A represents
      a packaging for the integrated device,
   a back side of a material B opposite to the front side, side walls that link the front side and the back side,
each side wall being coated with a coating material to at least 80% of its area,
the coating material being different from the material A and being different from the material B,
wherein one of:
  the front side is free from the coating material; or
  the coating material coated on at least one of the side walls wraps around a lateral end of the front side and covers less than 20% of the area of the front side.

2. The semiconductor package of claim 1,
wherein each side wall is a cut surface.

3. The semiconductor package according to claim 2,
wherein the coating material one or more of:
  seals the cut surface to reduce emission of particles related to a dicing process used to manufacture the cut surface, and
  seals the cut surface to protect it.

4. The semiconductor package according to claim 1,
wherein the coating material at each side wall comprises two front ends and a side face linking the front ends, wherein each side face is a cut surface.

5. The semiconductor package according to claim 1,
wherein the coating material has a width of less than 100 micrometers.

6. The semiconductor package according to claim 1,
wherein the coating material has the same width on all sidewalls of the semiconductor package.

7. The semiconductor package according to claim 1,
wherein the coating material comprises at least one of
  glue
  encapsulant
  acryl
  silicone
  epoxy
  polyurethane
  less than 10% filler particles.

8. The semiconductor package according to claim 1,
Comprising a sensitive element which is sensitive to one or more of:
  humidity
  temperature
  gas
  pressure
  gas flow
  differential pressure.

9. The semiconductor package according to claim 1,
wherein the coating material coated on at least one of the side walls has on a front end a positive or negative offset from the plane of the front side and/or back side of the semiconductor package.

10. The semiconductor package according to claim 1,
wherein the coating material coated on at least one of the side walls has at least one front end that has a meniscus-like shape.

11. The semiconductor package according to claim 1,
wherein at least one gap extending in a direction perpendicular to the side wall is filled by a portion of the coating material.

12. The semiconductor package according to claim 1,
wherein a front end of the coating material coated on at least one of the side walls is covered by a lateral extension of the front side material A or by a lateral extension of the back side material B.

13. A method for manufacturing a semiconductor package, comprising:
  (a) providing a semiconductor package assembly containing an array of semiconductor packages for manufacturing a plurality of semiconductor packages, each semiconductor package comprising
  an integrated device comprising a sensitive element,
  a front side representing a packaging for the integrated device,
    a front side of the semiconductor package assembly comprising access openings to the sensitive elements,
    the semiconductor package assembly having a thickness d0 and being attached to a dicing tape of thickness dd with the front side of the semiconductor package assembly facing the dicing tape,
  (b) fabricating a set of first dicing streets around semiconductor packages or groups of semiconductor packages with a width w1 and a depth d1<(d0+dd) from a backside of the semiconductor package assembly,
  (c) filling the set of first dicing streets at least partially with a coating material,
  (d) fabricating, in the coating material in each first dicing street of the set, a second dicing street with a width w2<=w1 and a depth d2>=d0 and d2<(d0+dd), resulting in semiconductor packages with side walls, each side wall being coated with the coating material to at least 80% of its area.

14. The method for manufacturing a semiconductor package of claim 13,
wherein the semiconductor package assembly has a front side of material A and back side of material B and wherein the coating material is different from material A and from material B.

15. The method for manufacturing a semiconductor package of claim 13,
wherein the set of first dicing streets is filled with the coating material by applying the coating material in the set of first dicing streets.

16. The method for manufacturing a semiconductor package of claim 13,
wherein the set of first dicing streets is filled with the coating material by depositing the coating material in areas outside of but in contact with the set of first dicing streets and filling the set of first dicing streets by means of capillary force.

17. The method for manufacturing a semiconductor package of claim 13,
wherein the second dicing street in the coating material in each first dicing street of the set is fabricated in the center of each first dicing street of the set in such a way that a plurality of individual semiconductor packages having side walls that are coated by coating material of essentially equal width are formed.

18. The method for manufacturing a semiconductor package of claim 13,
wherein the depth of the set of first dicing streets is equal to the thickness of the semiconductor package assembly.

19. The method for manufacturing a semiconductor package of claim 13,
wherein the depth of the set of first dicing streets is smaller than the thickness of the semiconductor package assembly.

* * * * *